US010066851B2

(12) United States Patent
Kreutzman

(10) Patent No.: US 10,066,851 B2
(45) Date of Patent: Sep. 4, 2018

(54) MICRO-GRID PV SYSTEM HYBRID HOT WATER HEATER

(71) Applicant: David Kreutzman, Louisville, CO (US)

(72) Inventor: David Kreutzman, Louisville, CO (US)

( * ) Notice: Subject to any disclaimer, the term of this patent is extended or adjusted under 35 U.S.C. 154(b) by 746 days.

(21) Appl. No.: 14/455,057

(22) Filed: Aug. 8, 2014

(65) Prior Publication Data

US 2014/0348493 A1 Nov. 27, 2014

Related U.S. Application Data

(62) Division of application No. 13/829,320, filed on Mar. 14, 2013, now Pat. No. 9,453,658.

(51) Int. Cl.
| | |
|---|---|
| *H02J 1/00* | (2006.01) |
| *F24H 1/00* | (2006.01) |
| *F24H 1/18* | (2006.01) |
| *H01L 31/042* | (2014.01) |
| *H02S 10/20* | (2014.01) |

(52) U.S. Cl.
CPC ........ *F24H 1/0018* (2013.01); *F24H 1/0027* (2013.01); *F24H 1/185* (2013.01); *H01L 31/042* (2013.01); *H02J 1/00* (2013.01); *H02S 10/20* (2014.12); *Y10T 307/406* (2015.04)

(58) Field of Classification Search
CPC .... F24H 9/2021; F24H 9/2035; F24H 9/2007; Y02B 10/20
See application file for complete search history.

(56) References Cited

U.S. PATENT DOCUMENTS

| | | | |
|---|---|---|---|
| 4,257,397 A | 3/1981 | Gouyou-Beauchamps | |
| 4,367,726 A | 1/1983 | Maes, Jr. | |
| 5,293,447 A | 3/1994 | Fanney et al. | |
| 5,775,107 A * | 7/1998 | Sparkman | F03G 6/02 60/641.1 |
| 6,463,212 B1 | 10/2002 | Salyer | |
| 6,837,303 B2 | 1/2005 | Butler | |
| 7,221,862 B1 * | 5/2007 | Miller | F24H 9/2021 219/497 |
| 7,793,652 B1 | 9/2010 | Delgado | |
| 7,827,814 B2 | 11/2010 | Slater | |
| 8,356,481 B2 | 1/2013 | Penev | |
| 8,375,934 B2 | 2/2013 | Zheng | |
| 8,485,178 B2 | 7/2013 | Diaz et al. | |
| 8,511,296 B2 | 8/2013 | Sweet | |
| 8,536,495 B2 | 9/2013 | Lako | |
| 2002/0084655 A1 | 7/2002 | Per-Anders et al. | |
| 2008/0205865 A1 | 8/2008 | Lesage et al. | |
| 2009/0038609 A1 | 2/2009 | Mastov et al. | |
| 2009/0188486 A1 | 7/2009 | Thomasson | |
| 2009/0211567 A1 | 8/2009 | Thomasson | |
| 2010/0031953 A1 | 2/2010 | Penev et al. | |
| 2010/0155386 A1 * | 6/2010 | Caves | F24H 9/2021 219/441 |

(Continued)

*Primary Examiner* — Sibin Chen
(74) *Attorney, Agent, or Firm* — Russell T. Manning; Marsh Fischmann & Breyfogle LLP

(57) ABSTRACT

Provided herein are systems and methods (i.e., utilities) that allow for the use of non-grid tied renewable energy systems (e.g., PV arrays and/or wind turbines) without requiring battery banks. In various aspects, these utilities permit the efficient use of renewable energy systems to generate electrical power as well as the ability to dynamically direct where such electrical power is applied.

7 Claims, 12 Drawing Sheets

(56) References Cited

U.S. PATENT DOCUMENTS

| | | | |
|---|---|---|---|
| 2010/0235008 A1* | 9/2010 | Forbes, Jr. | G06Q 10/00 700/291 |
| 2010/0319681 A1 | 12/2010 | Li | |
| 2011/0017201 A1 | 1/2011 | Yang | |
| 2011/0017273 A1 | 1/2011 | Roach et al. | |
| 2011/0139144 A1 | 6/2011 | Zheng | |
| 2011/0146665 A1 | 6/2011 | Scharfe | |
| 2011/0184585 A1 | 7/2011 | Matsuda et al. | |
| 2011/0277744 A1 | 11/2011 | Gordon et al. | |
| 2011/0305444 A1 | 12/2011 | Pussell | |
| 2012/0017886 A1 | 1/2012 | Gordon et al. | |
| 2012/0024372 A1 | 2/2012 | Delgado | |
| 2012/0047888 A1* | 3/2012 | Penev | F03G 6/065 60/641.15 |
| 2012/0060827 A1 | 3/2012 | Roetker | |
| 2012/0060829 A1 | 3/2012 | Duplessis et al. | |
| 2012/0078433 A1 | 3/2012 | Honma et al. | |
| 2012/0210999 A1 | 8/2012 | Straeter | |
| 2012/0242148 A1 | 9/2012 | Galati | |
| 2012/0279493 A1 | 11/2012 | Dotan | |
| 2013/0042635 A1* | 2/2013 | Nelson | F24H 1/205 62/79 |
| 2014/0203093 A1* | 7/2014 | Young | F24D 19/1066 237/8 A |

* cited by examiner

MICRO-GRID PV SYSTEM HYBRID HOT WATER HEATER

CROSS-REFERENCE

This application is a Divisional application of U.S. patent application Ser. No. 13/829,320 having a filing date of Mar. 14, 2013, the entire contents of which is incorporated herein by reference.

FIELD

Systems and methods (i.e., utilities) disclosed herein are directed to improvements to PV systems for residential and commercial applications.

BACKGROUND

Photovoltaic systems (PV system) utilize solar panels to convert sunlight into electricity. A typical system is made up of one or more solar photovoltaic (PV) panels, a racking system that holds the solar panels, electrical interconnections, and control components. The PV system generally provides electrical energy to a residential or commercial building.

A grid connected or grid-tied PV system is connected to a larger independent grid (typically the utility power grid) and often feed generated electrical power directly into the grid though a portion or all of the generated electrical power may be utilized by the residential or commercial building before being fed to the larger grid. Any excess electrical power fed to the grid may be credited to the owner of the PV system. That is, the feedback is done through a meter to monitor power transferred. Feeding the excess electricity into the grid requires the transformation of DC electricity generated by the PV panels into AC electricity by a special synchronizing grid-tie inverter. The grid-tie inverter converts DC electricity into AC electricity that is matched in phase and frequency with the AC electricity of the utility power grid prior to being fed into the utility power grid. Grid-interactive inverters typically cannot be used in stand-alone applications where utility power is not available. In this regard, such grid tie inverters require a reference voltage/current from the utility power grid to operate. Grid-tie inverters are also designed to quickly disconnect from the utility power grid if the utility power grid goes down. This disconnect functionality ensures that, in the event of the utility power grid going down (e.g., blackout), the grid tie inverter will shut down to prevent the energy it produces from being fed into the grid which may result in an islanding condition that may potentially harm any line workers who are sent to fix the utility power grid. Stated otherwise, when the utility power grid goes down, grid tied PV systems shut down. However, the use of grid tied system enables use of a PV system without extensive rewiring and without batteries.

Standalone systems do not have a connection to a utility power grid. In standalone photovoltaic power systems, the electrical power produced by the photovoltaic panels cannot always be used directly. More typically, all generated electrical power is utilized to charge a battery bank and application loads are connected to the battery bank.

Each of the systems has certain benefits and drawbacks. For instance, grid tied systems avoid the use of costly batteries but, due to the requirement that they shut down if the utility power grid goes out, do not provide energy during utility power loss. Standalone systems can be significantly simplified in relation to the grid-tied systems due to the elimination of synchronizing inverters and other components but require the use of costly battery banks.

SUMMARY

Provided herein are systems and methods (i.e., utilities) that allow for the use of a renewable energy systems (e.g., PV arrays and/or wind turbines) that may be utilized free of a utility power grid and without requiring battery banks. In various aspects, these utilities permit the efficient use of renewable energy systems to generate electrical power as well as the ability to dynamically direct where such electrical power is applied. That is, in various aspects, the presented utilities allow the selective application of power while being able to maximize power output of a renewable energy source.

According to a first aspect, a utility is provided that allows for dynamically allocating electrical power received from a renewable energy source (e.g., PV system, wind-turbine, etc.). Interconnected to one or more electrical outlet(s) of a switching circuit is a resistive load(s) that is adapted to convert electrical power to thermal energy. For instance, such a resistive load may be formed of a heating element that may be utilized to heat various media (e.g., water, etc.). Generally, the resistive load(s) acts as a sink for the utility allowing for utilization of all or a portion of the electrical power generated by the renewable energy system. In this regard, all electrical energy may be utilized such that a battery bank is not required for storage of electrical energy from the renewable energy system. In this regard, the utility may operate without tying to a utility power grid or the use of storage batteries. Also interconnected to the switching circuit via a second electrical output is at least one additional electrical application load. Such an electrical application load may be any application that utilizes electrical power. The utility further includes a controller that supports control logic that is adapted to allocate the electrical power between the electrical application load and resistive load. In this regard, the controller is operative to generate control signals that are received by the switching circuit that variously connects the electrical power to the electrical application loads and/or the resistive loads in accordance with the control signals. Typically, the controller will be operative to identify a current power capacity of the renewable energy source such that the power may be allocated between the electrical loads the resistive load.

In one arrangement, the controller is operative to apply electrical power from the renewable energy source in order to maximize the output thereof. For instance, in the case of a PV renewable energy source, it may be desirable to perform MPPT functionality in order to maximize the power output of the PV array. As will be appreciated, maximizing the power output of such a PV array requires balancing the total loads on the PV array with the capacity of the array. Accordingly, the controller may be operative to identify the electrical load requirements of one or more electrical application loads interconnected to the switching circuit. Once the load requirements are identified for one or more electrical application loads, the controller may interconnect loads for which sufficient power is available to the renewable energy source. At this time, any remaining electrical power may be directed to the resistive element. As will be appreciated, this allows for utilizing all electrical power produced by the renewable energy source free of storage of any power to the battery system or diversion of any excess power to an electrical power grid. In another arrangement, constant voltage MPPT tracking may be implemented. In such an arrangement, rather than maximizing the output of the PV array, the MPPT functionality may be utilized to maintain a desired voltage. In such an arrangement, the resistance of panel mounted devices (e.g., micro-inverters) and/or resistive elements may be adjusted to maintain a desired voltage form the PV panel. Such a voltage may be user selectable within a range of voltages provided by the PV panel.

In one arrangement, the utility is a PV system that utilizes DC power received from a PV array. In such an arrangement, MPPT algorithms may be implemented in order to enhance the power output of the array. In another arrangement, the utility utilizes a PV array that is adapted to provide AC power. In such an arrangement, each panel in the PV array may include a micro inverter that is adapted to generate AC power at the panel. In order to utilize AC power free of tying to a utility power grid, it may be necessary to generate a reference signal (e.g., non-grid reference signal) for receipt by the micro-inverters such that they may generate electrical power in accordance with predetermined characteristics of the non-grid reference signal. In one arrangement, such a non-grid reference signal is generated by the controller and provided to the micro-inverters of the array. In another arrangement, one of the micro-inverters of the array generates a non-grid reference signal and the non-grid reference signal is provided to the remainder of the panels of array. Such an arrangement allows for utilizing micro-inverters free of utility grid tying. In such an arrangement, any anti-islanding functionality may be removed from the micro-inverters.

In any arrangement, the utility allows for allocating electrical power between different applications. Accordingly, an owner of the system may direct where the electrical power is utilized. In this regard, the controller may allow for user inputs to identify the priority of the electrical applications. Further, if no electrical applications are currently active, the system may be operative to apply all electrical power to the resistive element to provide thermal energy. In one arrangement, such thermal energy is utilized to heat water in a hot water heating system.

In a further arrangement, the controller may operatively connect to a data network such that the controller may obtain utility power information. Such utility power information may include cost information for utility power (e.g., gas or electric). The controller may utilize such cost information in order to allocate the electrical power to maximize the economic benefit of the user. In one particular arrangement, the controller may further include an inverter that allows for providing some or all electrical power to a utility power grid. In such an arrangement, anti-islanding functionality may be included within the system. However, it will be appreciated that while the utility is connectable to a utility power grid, a primary function of the utility is to provide a micro-grid that is separate from a utility power grid such that the utility may operate autonomously from a utility power grid and operate when the utility power grid is down.

According to another aspect, a simplified PV system is provided that allows for generation of thermal energy free of battery storage or complex control arrangements. In this aspect, at least one PV panel, which generates electrical power, is interconnected to a switching circuit that is connected to a resistive load that generates thermal energy in response to electrical power. A controller is interconnected to the switching circuit that is operative to generate a control signal for receipt by the switching circuit which connects and disconnects electrical power to the first output and hence the resistive element. A voltage regulator circuit interconnects the electrical output of the PV panel and the controller such that the voltage regulator circuit provides regulated power originating from the PV panel to the controller for its operation. In this regard, the controller may be fully powered by the PV panel. That is, the controller may be free of any other power source for its operation.

In one arrangement, the utility further includes a temperature sensor that is operatively interconnected to the resistive load/heating element and/or media that the resistive load/heating element heats. In one arrangement, the temperature sensor is operatively interconnected to the voltage regulator circuit. The temperature sensor is operative to open and close in response to a threshold temperature within the heating element/media. In this regard, the temperature sensor is operative to open and close a circuit through the voltage regulator circuit. When the voltage regulation circuit is opened, the controller is deactivated. Likewise, when the temperature sensor detects a temperature below the threshold value the voltage regulation circuit is completed and the controller is powered. In one arrangement, the controller includes an electromagnetic device that allows for activating the switching circuit to connect and disconnect the heating element from the PV panel. In this regard, the entire system is controlled by the operation of the temperature sensor. In one arrangement, the temperature sensor is a bi-metallic element that opens and closes based on its temperature.

In a further arrangement, the utility includes an outlet that is connectable to an active load. In a further arrangement, the utility includes an adjustable resistive element for use in setting a substantially constant output voltage of the outlet.

According to another aspect, a utility is provided that allows for the autonomous use of a renewable energy system and utility power source for the heating of water. The utility includes a water tank having a first heating element and a second heating element. The first heating element is connectable to a renewable electricity source. In one arrangement, the renewable electricity source is a PV array. The second heating element is connectable to a utility power source (e.g., electricity or gas). Each of the first and second heating elements is controlled by a separate thermostat. In this regard, the systems may operate entirely without integration with one another. In one arrangement, the thermostat interconnected to the first heating element is set to a temperature that is higher than the thermostat interconnected to the second heating element. In this regard, the renewable energy powered heating element heats water within the tank to higher temperature than the utility powered heating element. Accordingly, the utility powered heating element may be active for shorter durations.

In one arrangement, a novel tank design is utilized where the first and second heating elements are disposed at a common level within the tank. In one particular arrangement, these heating elements are disposed in the upper half of the tank. This allows for heating water at the top of the tank where water is withdrawn from the tank. In a further arrangement, another heating element powered by the renewable power source is disposed within the tank at a location below the first and second heating elements. In such an arrangement, the upper elements may heat water in the upper portion of the tank to a predetermined temperature at which time the lower element may be activated to heat water in the lower portion of the tank.

In a further arrangement, a controller is provided in conjunction with the first heating element. This controller may be operative to dynamically apply electrical power received from the renewable energy source to the first heating element and/or other active electrical loads interconnected to the controller.

In another aspect, a preheat tank is provided that is connectable to a water heating system, which provides preheated water to the water heating system. In this aspect, the utility includes a tank with an inlet and outlet. The inlet is connectable to a water source and the outlet is connectable to a hot water heater. Disposed within the preheat tank is at least a first electrical element that is connectable with a PV power source. This electrical element may be interconnected to the thermostat that activates and deactivates the element based on temperature of water within the tank. The preheat tank may be utilized with existing water heaters, tankless water heaters and/or boilers among others.

DETAILED DESCRIPTION

Reference will now be made to the accompanying drawings, which at least assist in illustrating the various pertinent features of the presented inventions. The following description is presented for purposes of illustration and description and is not intended to limit the inventions to the forms disclosed herein. Consequently, variations and modifications commensurate with the following teachings, and skill and knowledge of the relevant art, are within the scope of the presented inventions.

Aspects of the present disclosure are directed to the use of a hybrid PV system, which may be free of grid-tying and/or selectively, attached to a utility grid. In one arrangement, the hybrid PV system utilizes a resistive load instead of a battery bank, which provides numerous benefits in relation to a standalone PV system utilizing a battery bank or a grid-tied PV system. Such benefits include, without limitation, reducing the overall costs of the hybrid PV system by the elimination of a battery bank, the ability to utilize the peak power output of the PV system, the ability to provide electrical power when a utility power grid goes down and/or the ability to dynamically apply energy output of the PV system to maximize the economic benefit and/or other benefit to the owner or operator of the PV system.

The present inventor has also recognized that in some locations, such as Hawaii, where significant PV resources are tied to the utility power grid, too much electrical power may be generated by renewable energy sources. For instance, excess power is generated by grid-tied renewable energy systems during daylight hours having the greatest solar intensity. Currently, the solution is for the grid-tied renewable systems to shut down or limit output to balance the current grid load with the current production of the utility power grid. In this arrangement, the owner of a PV system faces a situation where their PV system efficiency is reduced and potential benefit of the energy is lost. Further, some regions, such as Ontario Canada, have reached a saturation point for renewable resources and limits are in place on new interconnects to the grid. These situations undermine the purpose of having a PV system. Further, this situation is expected to become more common as PV systems use increases as portions of utility grid infrastructure are inadequate for increased capacity. The presented systems address these and other concerns by providing a PV system that forms its own micro-grid that may operate entirely autonomously of a utility power grid without requiring a battery bank. In further embodiments, the PV system may be utilized in conjunction with utility grid power sources for certain heating applications (e.g., water heating) where the PV system and utility grid power sources autonomously operate separate heating elements.

Figure 1A:
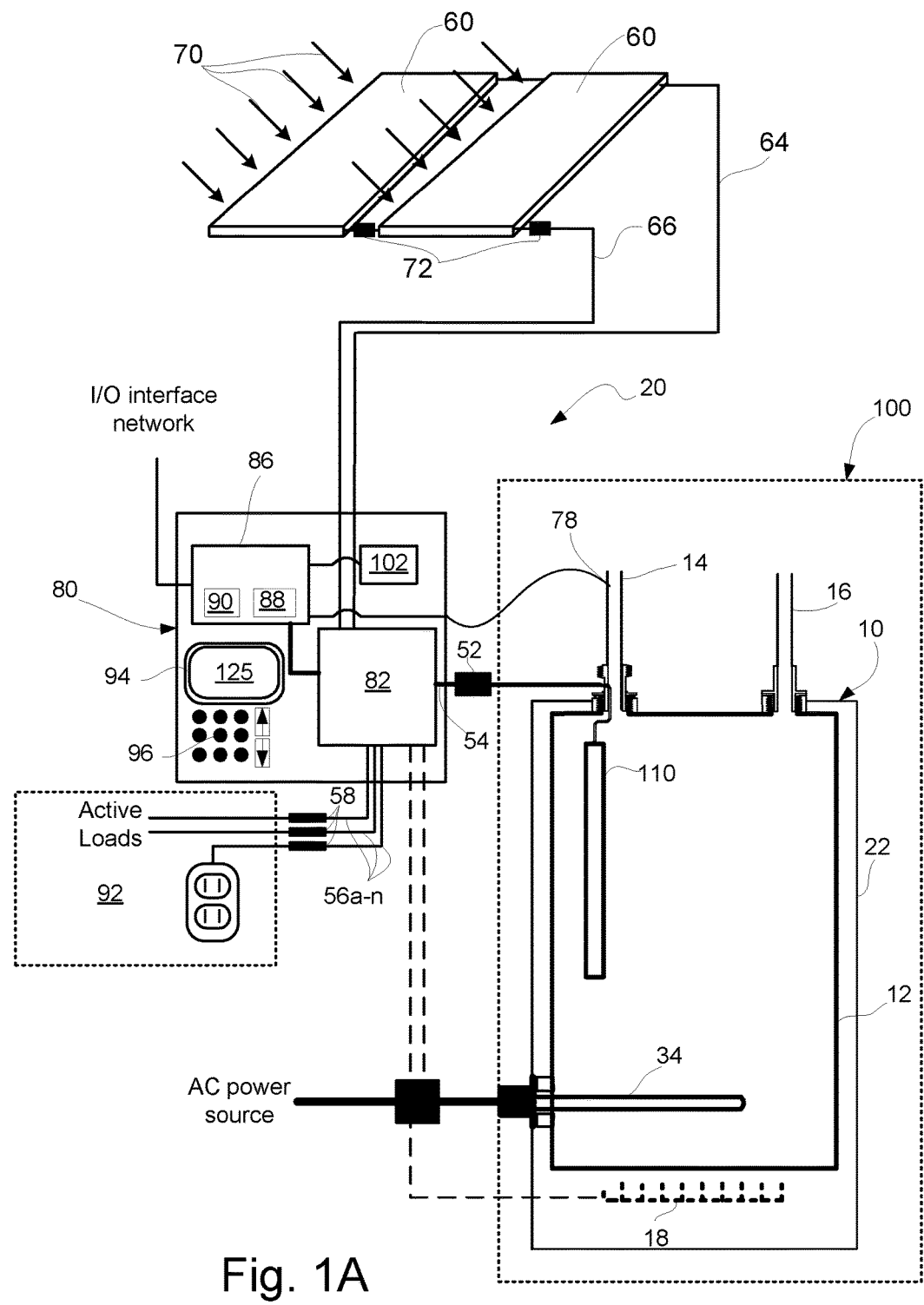
FIG. 1A illustrates a PV micro-grid system.

FIG. 1A illustrates a PV system 20 in accordance with certain aspects of the presented inventions. As shown, solar radiation 70 is received on photovoltaic arrays 60 which generate electrical power responsive to the solar radiation 70. The photovoltaic arrays include a large number of generally conventional photovoltaic cells, as well understood by those in the art. The present system 20 receives DC power or AC power from the arrays at a PV system controller 80 via a pair of electrical conductors 64, 66. The electrical conductors may be integrated into a common electrical cable (i.e., a two conductor cable). Further, the system may further incorporate a ground wire (not shown) that extends between the arrays 60 and the controller 80 (e.g., a three wire cable). Such a ground wire may be grounded to the electrical system of the structure incorporating the PV system 20 or may be directly grounded to a standard grounding rod.

The PV system controller 80 is interconnected to one or more electrical application loads 92 (e.g., active loads such as lights, appliances, resistive heaters etc.) and at least one sink or resistive load 100 to which power received from the PV arrays 60 may be directly applied. In this exemplary embodiment, the resistive load 100 is a heating element 110 of a hot water heater 10, as is more fully discussed herein. Instead of storing the power from the PV array to a battery bank, the controller 80 is operative to selectively and dynamically apply all or a portion of the electrical power to the active application loads 92 and/or directly the sink/resistive load 100 such that the power is converted to thermal energy. In instances where demand from active loads 92 connected to the controller 80 does not equal the solar array capacity, any excess power is directly applied to the resistive load 100 to balance the total load with the PV array capacity. For instance, maximum power point tracking may adjust the PV array operating point to the peak power point. In this regard, the maximum power output from the PV array may be utilized without requiring a battery for the PV system or tying the PV system to the grid. Further, the resistive load allows for absorbing spikes in the electrical power without damage to the active loads. Finally, where the resistive load is utilized to heat water, power that would not be generated if the PV system was balanced with the active load is applied to a beneficial use.

In one embodiment, the solar arrays 60 each include a micro-inverter 72. Each micro-inverter 72 converts direct current (DC) electricity from a single solar panel to alternating current (AC) electricity. The electric power from several micro-inverters is combined and fed into the controller 80. Micro-inverters contrast with conventional string or central inverter devices, which are connected to multiple solar panels. Micro-inverters have several advantages over conventional central inverters. The main advantage is that even small amounts of shading, debris or snow on any one solar panel does not disproportionately reduce the output of an entire array. Each micro-inverter 72 may obtain optimum power by performing maximum power point tracking (MPPT) for its connected panel. MPPT is a technique that panel mounted micro-inverters use to get the maximum possible power from one or more solar panels. As will be appreciated, solar cells have a complex relationship between solar irradiation, temperature and total resistance that produces a non-linear output efficiency known as an I-V curve. The purpose of the MPPT functionality is to sample the output of the cells and modify the voltage and current to obtain maximum power for any given environmental conditions.

Previously, each micro-inverter required a power utility grid input reference signal to operate. That is, previous micro-inverters are designed to match their outputs with utility grid power in order to feed power into the grid. In this regard, previous micro-inverters are designed to synchronize their frequency with that of the utility power grid (e.g. 50 or 60 Hz) using a local oscillator, which utilizes a reference signal from the utility power grid. That is, the micro-inverts have an on-board circuitry which will sense the current AC grid waveform, and generate an output voltage/current that corresponds with the utility grid power.

In order to provide a nongrid-tied PV system that utilizes individual micro-inverters with the PV panels in the array, in one embodiment the controller 80 generates a non-grid reference signal that allows the micro-inverters 72 to operate as if they were receiving a reference signal from a power utility grid. In this regard, the controller 80 may optionally include a small energy storage device 102 (e.g., battery, capacitor, etc.) that is operative to generate the necessary reference signal that is provided to the micro-inverters 72. The battery 102, while being recharged by the PV array, does not store the energy from the array 60 in a magnitude to be considered a battery bank for the PV system. Rather, the on-board battery 102 stores sufficient energy to allow for the generation of the non-grid reference signal while the PV system is operating. Accordingly, the controller 80 may include an oscillator that is operative to utilize electrical energy from the on-board battery 102 to generate a non-grid reference signal having a required frequency, current and/or voltage to allow the micro-inverters 72 to match their output power to the non-grid reference signal. In another embodiment, one of the micro-inverters 72 generates the non-grid reference signal. In this embodiment, the micro-inverter that generates the non-grid reference signal (e.g., master micro-inverter) provides the non-grid reference signal to the remainder of the micro-inverters in the array (e.g., slave micro-inverters). The slave micro-inverters then utilize this reference signal to match their power output to the non-grid reference signal of the master micro-inverters. In either embodiment, what is important is that without a reference signal to synchronize to, the power output of the micro-inverters 72 may drift from the tolerances required by equipment (e.g., loads) connected to the controller. This concern is alleviated by the present system 20 by the generation of the non-grid reference signal by the controller 80 or a master micro-inverter.

Previous micro-inverters have also had anti-islanding protection in accordance with UL 1741. In the event of a power failure on the power utility grid, it is generally required that any grid-tie inverters attached to the grid turn off in a short period of time. This prevents the inverters from continuing to feed power into small sections of the grid known as "islands". Powered islands present a risk to workers who may expect the area to be unpowered. Anti-islanding protection functionality is removed from the micro-inverters 72 of the present system 20. As the PV system 20 in one embodiment forms it own micro-grid and is not connected to the utility power grid such anti-islanding protection is not required and such functionality is removed from the micro-inverters.

Through the provision of a non-grid reference signal, inclusion of a resistive load 100 and, in some embodiments, removal of anti-islanding functionality from the PV micro-inverters 72, the present system 20 provides a micro-grid electrical generation system that allows for highly efficient operation without the inclusion of a battery bank(s) and without grid-tying. Accordingly, the system can generate power even when a utility power grid is down. That is, as opposed to grid-tied PV systems that shut down when the utility power grid goes down, the present system allows for continued operation in 'black-out' conditions. As will be appreciated, owners of previous grid-tied PV systems have found that, while they have PV electrical generation systems, they are without power when the utility power grid goes down leaving them in no better condition than their neighbors without a PV system. Likewise, previous owners of PV systems that are operative when a utility power grid goes down have relied on PV systems that do not utilize individual micro-inverters and which typically utilize DC power to charge battery banks.

Figure 2:
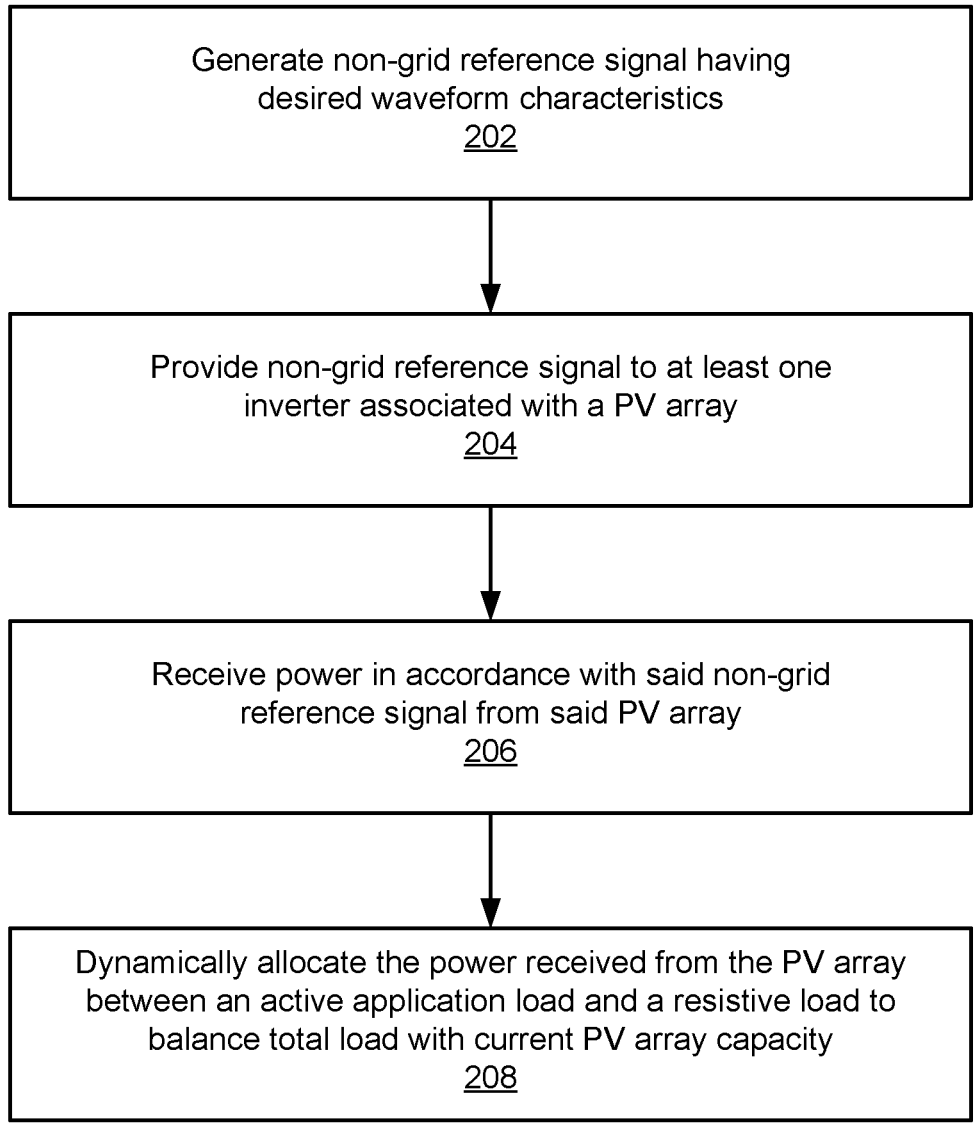
FIG. 2 illustrates a process that may be implemented by the system of FIG. 1.

FIG. 2 illustrates one process 200 that may be implemented by the present system 20. Initially, the process 200 includes the generation 202 of a non-grid reference signal (e.g., at the controller 80 or at a master micro-inverter) having desired waveform characteristics. In this regard, the non-grid reference signal may include the desired frequency and/or maximum voltage that may be utilized by the inverters of the PV array. Accordingly, the non-grid reference signal is provided 202 to the micro-inverters 72 of the PV array 60. Power is then received 206 from the PV array in accordance with the waveform characteristics of the non-grid reference signal. At this time, the controller 80 is operative to dynamically allocate 208 the power received from the PV array 60 between one or more active application loads and a resistive load in order to balance the total current load with the total current PV array capacity. In this regard, the PV array may operate at or near maximum output capacity without requiring grid-tie or battery banks to utilize any excess power above the load requirements of the active application loads.

Though primarily discussed as utilizing micro-inverters 72 that allow the PV array 60 to provide AC electrical power to the controller 80, it will be appreciated that in other embodiments, the PV array may provide DC power to the controller which then applies DC power to active application loads (e.g., DC devices) and a resistive load(s) free of battery storage. In such an arrangement, MPPT algorithms may likewise be implemented to enhance or tailor the power output of the array. Further, while discussed as utilizing MPPT (e.g., in micro-inverters for AC systems or in a DC system) for maximizing the output of the PV array, if will be further appreciated that the MPPT functionality may be utilized to match the power from the PV array with a particular application load. For instance, where the resistive load forms a heating element in hot water heater, MPPT functionality may be utilized to condition the generated power to match the requirements of the heating element. That is, the generated power may be conditioned to have voltages or currents that are within an acceptable window for the resistive element. Such tailoring of the electrical power may allow the system to be utilized with varying resistive elements and/or active loads.

Figure 3:
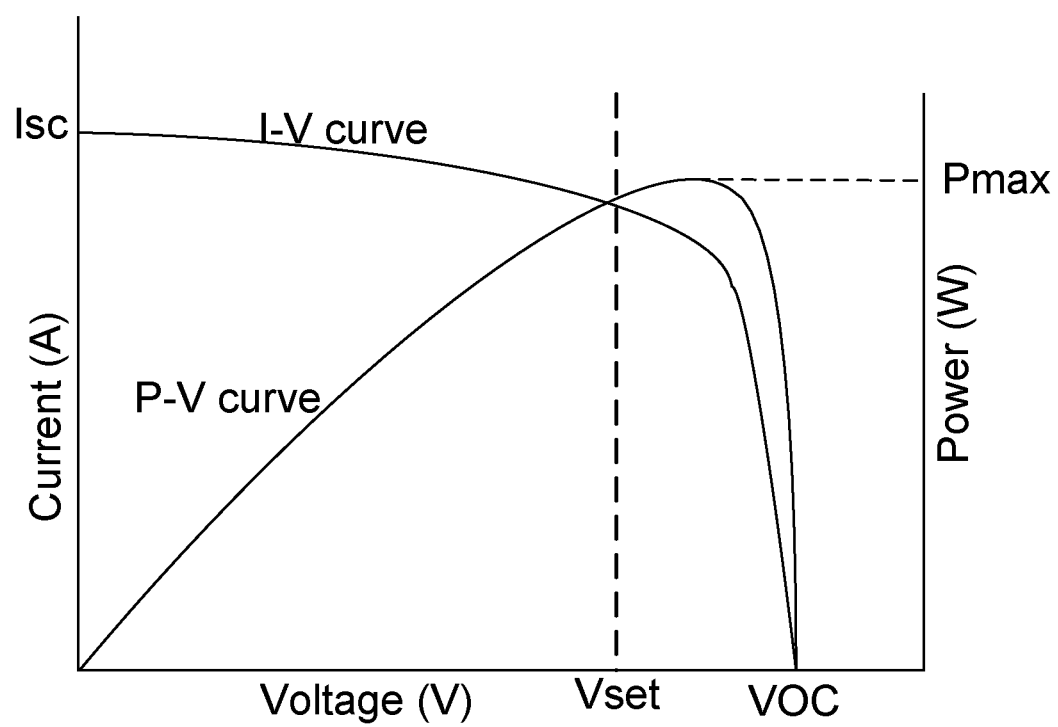
FIG. 3 illustrates operating curves of a PV array.

In a further embodiment, rather than maximizing the power output of the array, the output voltage of the array is regulated to a constant value. The generation of a constant voltage from the PV array may allow the use of a PV array to power standard electronic devices (e.g., 110V electronics) that require voltages within a narrow operating window. In order to generate a constant voltage, the controller and/or the micro-inverters mounted to each panel may vary the resistance seen by the array. As will be appreciated, photovoltaic cells have a complex relationship between their operating environment and the maximum power they can produce. For any given set of operational conditions (e.g., temperature, solar intensity), cells have a single operating point where the values of the current (I) and Voltage (V) of the cell result in a maximum power output. These values correspond to a particular load resistance, which is equal to V/I as specified by Ohm's Law. The power P is given by P=V*I. The I-V curve and P-V curve for a single set of operational conditions is shown in FIG. 3. These are dynamic quantities which changes depending on the level of illumination, as well as other factors such as temperature and the age of the cell.

As shown, the maximum power point or peak power point occurs at the apex or "knee" of the P-V curve. Accordingly, MPPT tracking typically alters the load presented to the panels to shift the array operating point to the peak power point. In operation, a load with resistance R=V/I would draw the maximum power from the device. Likewise, the presented systems allow for altering the resistance of the loads to match the maximum power potential of the array. However, MPPT tracking may shift the array operating point away from the peak power point from the peak power point to maintain a constant voltage (e.g., user selected or set voltage) as illustrated by the dashed line $V_{SET}$. That is, as V=IR, it is possible to vary the resistance to maintain a constant voltage. The presented systems allow for altering such resistance using micro-inverters and/or variable resistance sinks/resistive loads.

Referring again to FIG. 1A, one exemplary resistive load 100 in accordance with various aspects of the presented inventions is illustrated. In this embodiment, a hot water heater 10 is provided that may be utilized to heat water for residential and/or commercial applications. A supplemental heating element 110 (i.e., resistive load) generates heat in response to an applied current from the controller 80. In this regard, the inclusion of this heating element 110 into the hot water heater 10 allows for the direct application electrical power from the controller 80. This allows any excess power from the PV array, which is not utilized by active application loads (i.e., if utilized), to be utilized to heat water and thereby allows balancing a total load with the PV array capacity. Such a supplemental hot water heating system is set forth in co-owned U.S. patent application Ser. Nos. 13/442,701; 13/442,714; 13/442,753; and Ser. No. 13/442,737, the entire contents of which are incorporated herein by reference.

As shown, the hot water heater 10 is an electrical hot water heater that utilizes an electrical heating element 32 as a heat source for heating water within a storage tank 12. The element 32 is controlled by a thermostat (not shown), which activates the element 32 (e.g., completes a circuit) when a temperature within the tank 12 drops below a predetermined temperature. Typically, the tank 12 is disposed within an outer casing 22 that surrounds the tank. Insulation typically fills the space between the outer casing 22 and the tank 12. In the present embodiment, a primary or standard electrical element 32 is disposed through an access opening (not shown) extending through the side of the tank 12. This element 32 is electrically connected to a utility power grid source (e.g., 220 v AC source).

A cold water inlet 16 and hot water outlet 14 enter the tank 12 via apertures in the tank. The external ends of the inlet pipe is connected (e.g., soldered) to a water supply pipe (not shown). The external end of the outlet pipe is connected to the plumbing that connects to hot water taps in the house (or other structure). The tank 12 stores heated water until a user opens a tap, which allows water to exit from the top of the hot water heater 10 through a hot water outlet 14. In conjunction with the water exiting the tank 12, water is introduced into the hot water heater via a cold water supply inlet 16.

FIG. 1A also illustrates (e.g., in phantom) components of a gas fired hot water heater. The gas fired water heater includes a burner 18 disposed below the tank 12, which is controlled by a thermostat, that ignites when a temperature within the tank 12 drops below a predetermined temperature. The burner 18 may further include a standing pilot light, piezoelectric ignition system or other ignition system. In such a gas-fired hot water heater, an exhaust gas chimney or internal flue (not shown) would extend through the center of the tank to vent combusted burner gases to an outside vent. The present system may be utilized with an electric, gas or hybrid (i.e., gas and electric) hot water heater.

In the present embodiment, the supplemental heating element 110 is inserted into the water heater 10 though the outlet orifice. However, it will be appreciated that the location and configuration of the supplement heating element 110 may be varied as set forth in U.S. patent application Ser. Nos. 13/442,701; 13/442,714; 13/442,753; and Ser. No. 13/442,737 as previously incorporated. In this regard, the supplemental heating element may be adapted for insertion into, a pressure relief valve opening, a drain valve opening, circulation port, an anode opening, primary electrical heater element opening and/or a combination thereof. The size and configuration of the electrical element 110 may be selected based on the size of the tank, power rating of the renewable energy source etc.

While the resistive load 100 illustrated in this embodiment is a heating element 110 that is disposed within a hot water heater 10, it will be appreciated that other resistive loads may be utilized as well. By way of example only, other resistive loads may include heating elements (e.g., heated flooring underlayments, space heaters, ovens etc.). What is important is that there is a resistive load available to utilize any excess (or potentially all) power generated by the PV array such that the output of the PV array may be maximized or tailored to a particular voltage without the use of battery banks or grid-tying.

The controller 80 is operative to monitor the operation of the PV array 60 and dynamically allocate power from the PV array 60. Monitoring the operation of the PV array may include monitoring one or more photovoltaic sensor signals (e.g., radiation intensity signals) and/or temperatures signals. The power output by the arrays 60 can also be monitored/measured. In any arrangement, the controller 80 is operative to determine the amount of power being generated by the PV array such that the power may be allocated to an active load(s) 92 and/or the resistive load 100. The controller 80 may also provide control signals to the PV array 60 to maximize the power output or generate a desired voltage. When micro-inverters 72 are utilized to convert DC electricity to AC electricity at the solar arrays 60, the conduction of AC power over the electrical connectors permits communication between the controller 80 and the solar arrays 60 via the electrical conductors 64, 66. That is, the system may utilize power line communication (PLC) to carry data on conductor 64, 66 that is simultaneously utilized for AC electric power delivery to the controller 80. In this regard, the reference signal may be supplied to the micro-inverters 72 via one of the conductors 64 or 66. However, this is not a requirement.

The controller 80 in the present embodiment further includes a processing unit 86 that includes a processor 88, memory 90 and one or more input/output interfaces. The processor 86 performs various control operations (e.g., control logic) stored within volatile and/or non-volatile memory. Other components of the controller 80 are within the skill of the art and are within the scope of the present invention. For example, controller 80 may also include an analog-to-digital converter for converting the signal proportional to the incident radiation provided by a sensor or PV panel to a digital value and a microprocessor or similar device for controlling one or switches to selectively apply power to one or more active loads and/or resistive elements. In this regard, the controller may generate active load control signals and resistive load control signals to affect operation of one or more switches to connect and disconnect the active loads and resistive load(s). The controller also includes a display 94 and a user input device 96.

As shown in FIG. 1A, the controller 80 also includes an electronic switching circuit 82. The electronic switching circuit 82 may include various switches (e.g., solid state switches, etc.) that allow for selectively completing or opening and closing circuits between the PV arrays 60 the active load(s) 92 and/or the resistive load 100. As shown, the switching circuit 82 receives power from the PV arrays 60 and selectively allocates that power to the active load 92 and/or resistive load 100 at the control of the processor. In this regard, a first output 54 is interconnected to the resistive load 100, which in the present embodiment is the supplemental heating element 110 disposed within the hot water heater 10. Additional outputs 56a-n may be interconnected to one or more active application loads 92. For instance, such active loads may include, without limitation, lighting that is utilized during working (e.g., daylight) hours, blowers associated with heating systems (e.g., natural gas), refrigeration/freezing systems, heating or air conditioning devices, etc. In such an arrangement, the controller is operative to assess the power needs of the active loads such that power may be dynamically distributed between the active loads 92 and the resistive load 100 to maximize the power output of the PV array 60 and/or maintain a desired output voltage.

In one arrangement, each of the outputs 56a-n includes a load indicator 58 for use determining the current load requirements of the active loads. In one specific embodiment, the load indicator 58 is formed of a shunt resistor sized for the intended active load that provides an output which indicates when the circuit is operating at full capacity. The active loads may be serially activated until insufficient power is available to operate the active circuits at full capacity. Accordingly, the circuits for which full power is available may be activated, and active loads for which insufficient power is available may remain inactive and any remaining power may be allocated to the resistive load, which may further include a variable resistor 52 (e.g., rheostat, potentiometer etc.) to maintain a balance between the active loads and the resistive load and/or to adjust the resistance provided by the resistive load to generate a desired voltage, which may be selected by a user.

Alternatively, all power may be initially applied to the resistive load and each active load may be individually activated. The resulting power drop of the resistive circuit may be measured to derive the load requirement of each active load. In any arrangement, once the load requirements of the active loads are determined, the active loads may be connected to the electrical power from the PV array. Likewise, if insufficient power is available for all active loads, the active loads may be powered in order of importance, which may be dictated by the system owner. Further, the controller 80 may include a standard output 56c (e.g., 12 v DC, 24 v DC, 110 v AC or 220 vAC outlet) that allows for plugging an electrical device into the controller 80. In this regard, if utility power is not available, a system owner may plug an electrical device directly into the micro-grid of the PV system to power that device.

In any arrangement, the processor 88 can execute software or other executable code/logic stored in the memory 90. The software/logic stored within the volatile memory may also allow the processor to monitor power produced by the PV array 60 and dynamically allocate this power between the active application loads and/or the resistive load. Further, such software/logic may allow a user to select where and/or with what priority the electricity is allocated.

The controller 80 may be provided with originally installed systems. However, it will be further appreciated that the controller may be incorporated into existing PV systems as well. For instance, an existing DC grid-tied system could be retrofit with the controller 80 to allow a user to selectively determine where generated power is applied. In such an application, the controller may be retrofit between the PV modules/array of the existing system and the grid-tie inverter of the system. At least one resistive load would be attached to the controller and one or more active loads may also be attached to the controller. In such an arrangement, a relay switch (e.g., manual or automated) may be disposed between the controller and the grid-tie inverter to allow disconnecting the PV array and controller from the grid in the event of a grid power failure. In a further arrangement, the controller may incorporate an inverter to provide AC power for output to one or more active loads.

Figure 4:
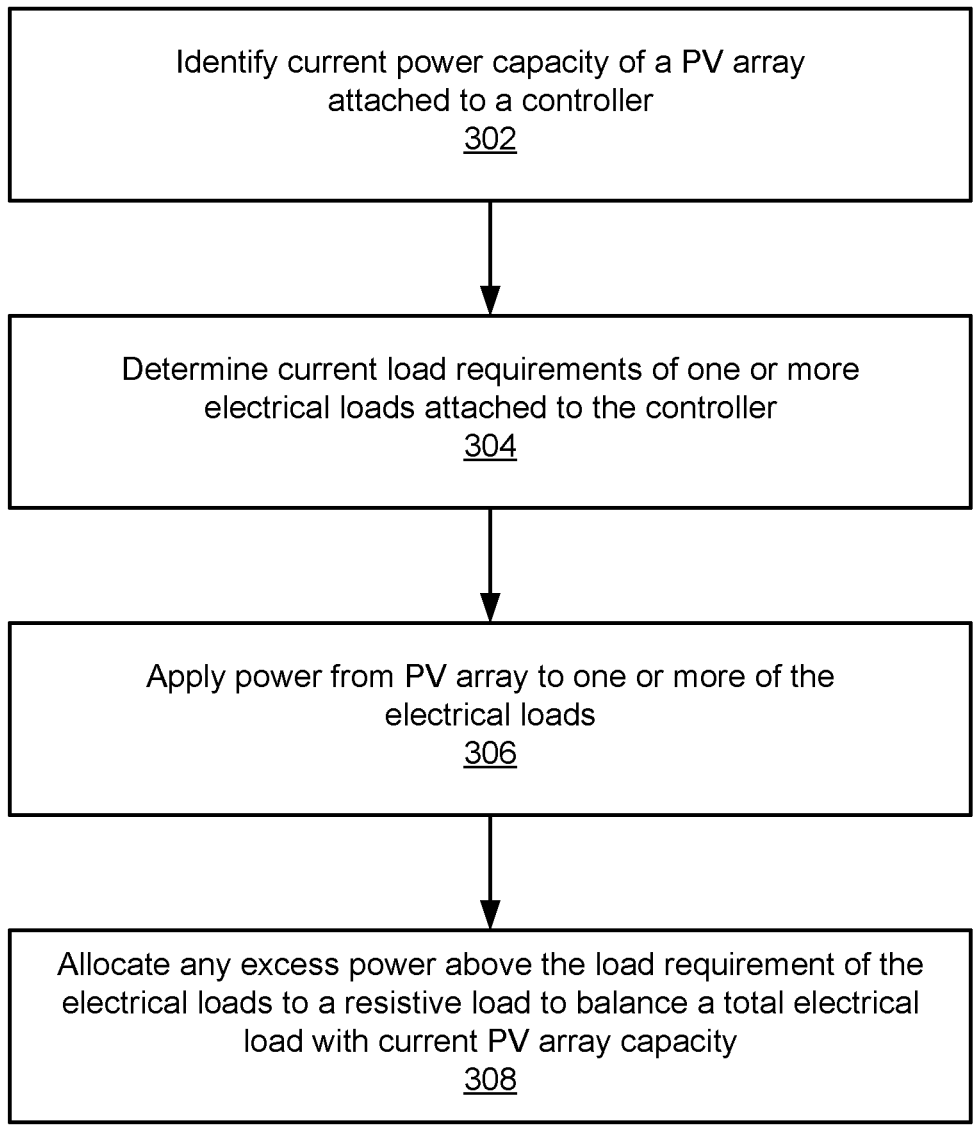
FIG. 4 illustrates a process that may be implemented by the system of FIG. 1.

A process 300 that may be implemented by the controller is illustrated in FIG. 4. Initially, the controller 80 is operative to identify 302 the current power capacity of the PV array attached to the controller. In addition to identifying the current power capacity the PV array, the controller 80 is also operative to determine current load requirements 304 of one or more active electrical loads attached to the controller 80. Based on the available power capacity and current load requirements, the controller is operative to determine which of the active loads can be powered and then selectively apply power 306 from the PV array to fully power one or more of the active loads. The controller 80 is further operative to allocate 308 any excess power above the load requirements of the active loads to the resistive load in order to balance the total electric load with the current PV array capacity and/or to maintain a desired voltage output of the PV array. Again, this allows for powering one or more active electrical loads while utilizing the full capacity of the PV array for the benefit of the PV system owner.

Figure 1B:
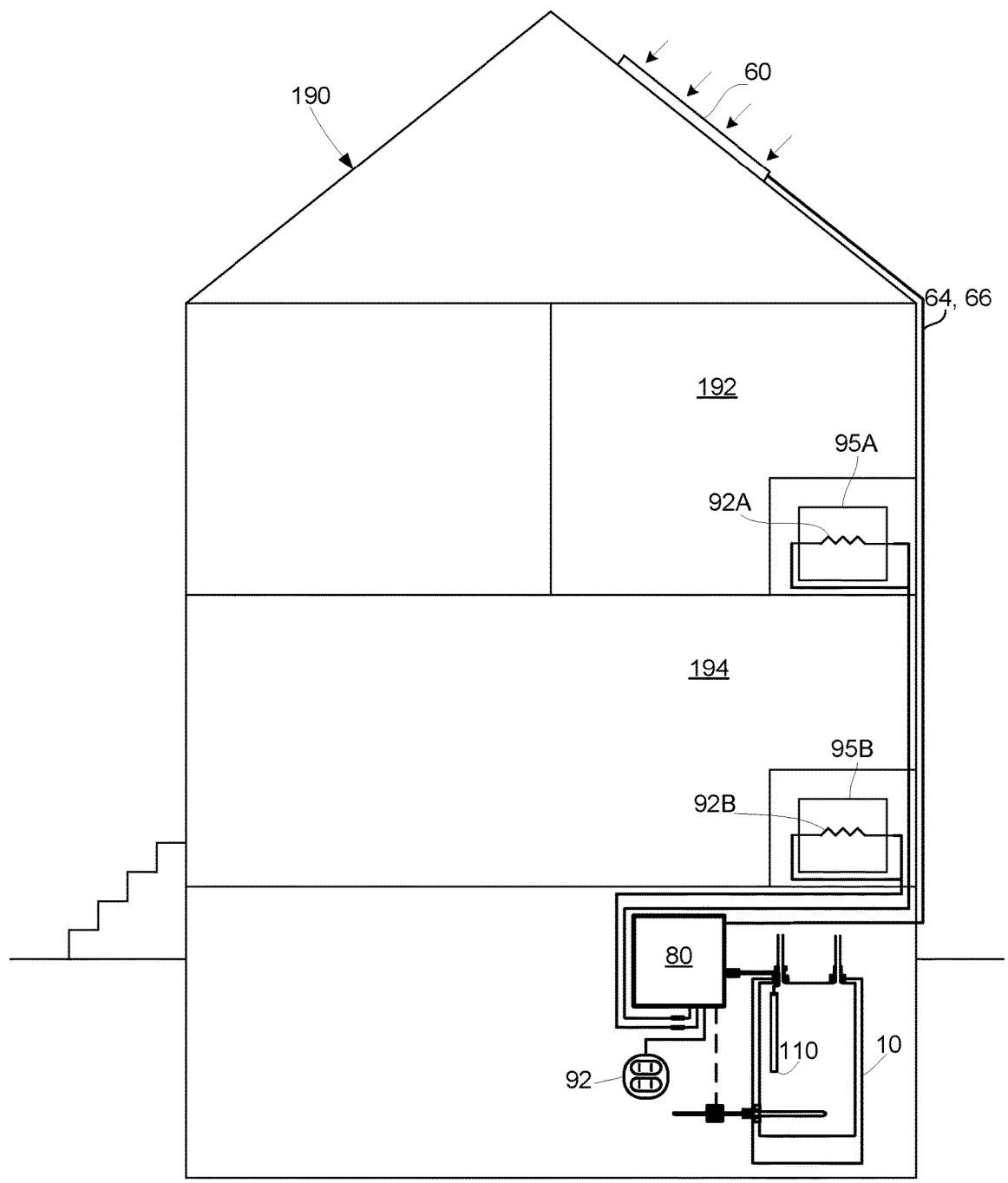
FIG. 1B illustrates a PV micro-grid system with multiple active loads.

FIG. 1B illustrates the PV system 20 of FIG. 1A as incorporated into a residential structure 190. This application could likewise be incorporated into a barracks, commercial warehouse, or apartment complex with multiple points of use. Accordingly, FIG. 1B is presented by way of example and is not meant to be limiting. In the illustrated embodiment, the controller is interconnected to the resistive load defined by the hot water heater 10. In addition, the controller is interconnected to two active loads 92a, 92b. In this embodiment, the active loads 92a, 92b are point source water tanks disposed within a vanity in a bathroom 192 and a kitchen 194. In this embodiment, each of the active loads is formed of a resistive element that is disposed within a tank 95a, 95b. Each of these tanks is connected to a tap in a sink of their respective room. Accordingly, when the tap is opened, hot water is provided from the respective tank 95. In such an arrangement, the controller 80 may be operative to monitor the temperature of each tank 95a, 95b and dynamically apply electrical power to the resistive element as needed in order to maintain a point source supply of hot water. Such a system may reduce the overall use of hot water from the hot water heater 10. That is, if hot water is available at the point of use, there may be no need to run hot water from the hot water heater 10 to the point of use. In such an arrangement, especially if the point source tanks 95a, 95b have a supplemental heating element (e.g., 110v AC), such point source locations may not need to any hot water connection to the primary water heater 10. Utilizing the system in this arrangement could allow the owner or user to optimize efficiency in terms of minimizing consumption and decreased cost of maintaining centralized hot water "on demand". Further, it will be appreciated that such a system could be implemented with tanks having grid-tied elements.

Referring again to FIG. 1A, it is further noted that the controller may also be connected to a communications interface that may be represented by a variety of different devices. In this regard, the controller may be interconnected to a data network via, for example, Ethernet, RS485, SD card, a USB connection and/or a telephonic connection (e.g., cellular or landline.) In this regard, the controller may be interconnected to external systems that may interact with and/or provide further control inputs to the controller 80.

The communications ability of the controller 80 allows in some embodiments for the system to utilize smart grid information. The term "smart-grid" generally refers to a utility power grid that allows communication between the utility power grid and the end user's electrical devices (load/demand). The communication between supply and demand enables the efficient, "smart" use of electricity. The smart-grid generally allows utilities to gather real-time information about load demands, upsets, outages, and net metered (customer owned) generation. In some arrangements, such smart grid functionality also allows a utility power provider to control operation of one or more customer devices. More importantly in the present application, data connection with a smart grid, or other data communication with a utility, allows the PV system to have-real time information about the immediate availability of power and its cost, as well as what the availability and cost will be in the very near future. Similarly, the controller may communicate with other utilities to determine the cost of other power sources. Such information may allow the controller to dynamically apply the power from the PV array(s) 60 to loads (e.g., active application load(s) and/or resistive loads) to enhance the economic benefit of the system 20 for its owner.

In this embodiment, the PV system 20 may obtain information from a utility source relating to the current cost of the utility provided power. Likewise, the system may obtain information (e.g., input from the system user, obtained on-line etc.) relating to the cost of, for example, fossil fuel sources (e.g., heating oil, natural gas). This information may be utilized in conjunction with information relating to the available capacity of the PV array, the load requirements of one or more active applications and/or the heating requirements of a resistive load. Based on this information, the PV system may be operative to selectively apply PV power to enhance the benefit to the PV system owner.

For instance, referring again to FIG. 1A, the PV system 10 is operative to heat water within a hot water heater 10. In this regard, it has been determined that approximately 30% of the power consumption of an average household is directed to heating water. Due to the high percentage of overall power consumption of heating water, the most economically beneficial use of the PV power in many instances is to heat the water in the hot water heater to prevent the system owner from purchasing power (e.g., electrical power or natural gas/propane) for heating water. However, this determination may vary based on the varying price of electrical power. That is, in some utility power grids, the price of electricity varies throughout the day based on overall grid demands. Energy generated at peak demand times may be valued higher than that generated at off-peak demand times. This is also known as "time of use tariff," or TOU. The TOU rates are scaled so that electricity at off-peak times is charged at a discount, and electricity at peak times is charged at a premium. In the Southwestern United States, peak demand usually occurs approximately two to four hours after the peak sunshine period of the day (i.e. approximately 3:00 p.m. to 6:00 p.m.). Energy consumed at the peak will cost the consumer more. Accordingly, the ability of the controller 80 to obtain such information allows for altering the allocation of the PV power from the array.

During peak-times when electrical power costs are high, it may be more economically beneficial for the controller to allow a gas hot water heater to utilize a fossil fuel source to heat water and utilize all available PV power to operate other electrical loads. Likewise, at off-peak times when electrical power costs are low, it may be more economically beneficial to direct all available PV power to heat water in the hot water heater and purchase electrical power to handle other needs. In such an arrangement, the controller 80 may also be interconnected to the gas heating element 18 of the hot water heater (or electric element 34 in the case of an electric hot water heater), which is interconnected to a utility or fossil fuel power source. In this arrangement, the controller 80 implements logic that allows for controlling both the supplementary heating element 110 and the standard heating element 18 of the hot water heater 10.

In addition to being connected to the active application load(s) and resistive load(s), the controller 80 may, in another embodiment be operatively interconnected to the power utility grid. In such an arrangement, the system 20 includes a grid-tie inverter (e.g., in the controller 80 and/or grid-tie micro-inverted mounted on the panels individually or otherwise) such that the generated power may be diverted into the power utility grid. As will be appreciated, return of such energy to the grid may allow the system owner to sell or 'net-meter' power back to the utility.

In such an embodiment, the PV system can, based on economic considerations, input energy back into the utility power grid. In such an arrangement, the micro-inverters 72 will include anti-islanding functionality and the controller may provide a grid reference signal to the micro-inverters 72. In this embodiment, the PV system has the further ability to sell power back to the grid (e.g., net-meter) if beneficial to the PV system owner. Specifically, this embodiment balances the benefit of using PV power to operate a resistive load to generate heat (e.g. hot water, space heating etc) relative to selling (e.g., net metering) the PV power to the utility power grid.

Figure 5:
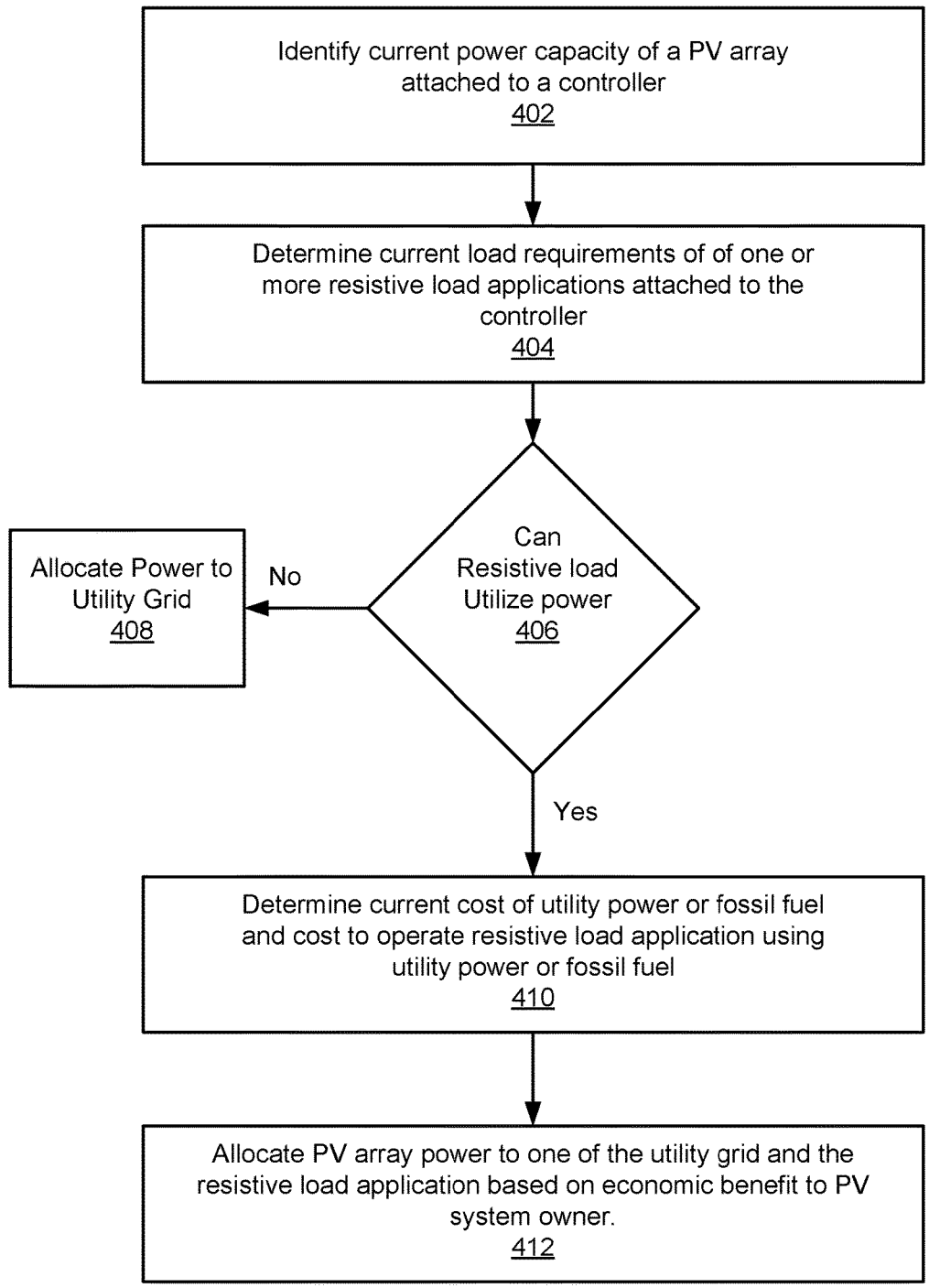
FIG. 5 illustrates a process that may be implemented by the system of FIG. 1.

A process 400 for determining the benefit of using PV power for resistive heating applications relative to selling the PV power to a utility power grid is set forth in FIG. 5. Initially, the process includes identifying 402 the current PV power capacity of PV array connected to a controller. The process further includes determining 404 the current load requirements of one or more resistive load applications. By way of example where the resistive load application includes heating water in a hot water heater, this determination may include identifying the current temperature of the water with the hot water heater and/or identifying expected usage times for the hot water heater. In the latter regard, the user may input information into the controller regarding usage times and/or the controller may incorporate logic that allows for determining such usage times. In any arrangement, a determination 406 may be made as to the availability of the resistive application load to currently utilize the PV power. If the resistive application load cannot utilize the PV power, the controller directs the PV power into the grid to sell the power 408. If the resistive load application can utilize the PV power, a determination 410 is made as to the cost of utility power (e.g., electricity, natural gas) or fossil fuel (e.g., propane, fuel oil) and the cost to operate the resistive load using the utility power or fossil fuel. If it is more cost effective to utilize the utility power/fossil fuel to operate the resistive load application or more beneficial to entirely disable the resistive load (e.g., utility powered electrical element of a hot water heater), then the PV power is allocated 412 to the utility grid. If it is more cost effective to use the PV power to operate the resistive load, the PV power is allocated 412 to the resistive load. In the latter regard, the controller may be operative to deactivate the utility power/fossil fuel from the resistive load. For instance, in the case of a natural gas/propane burner in a hot water heater, the burner may be deactivated while the PV power is utilized to provide heat to an electric element within the hot water heater.

Figure 6:
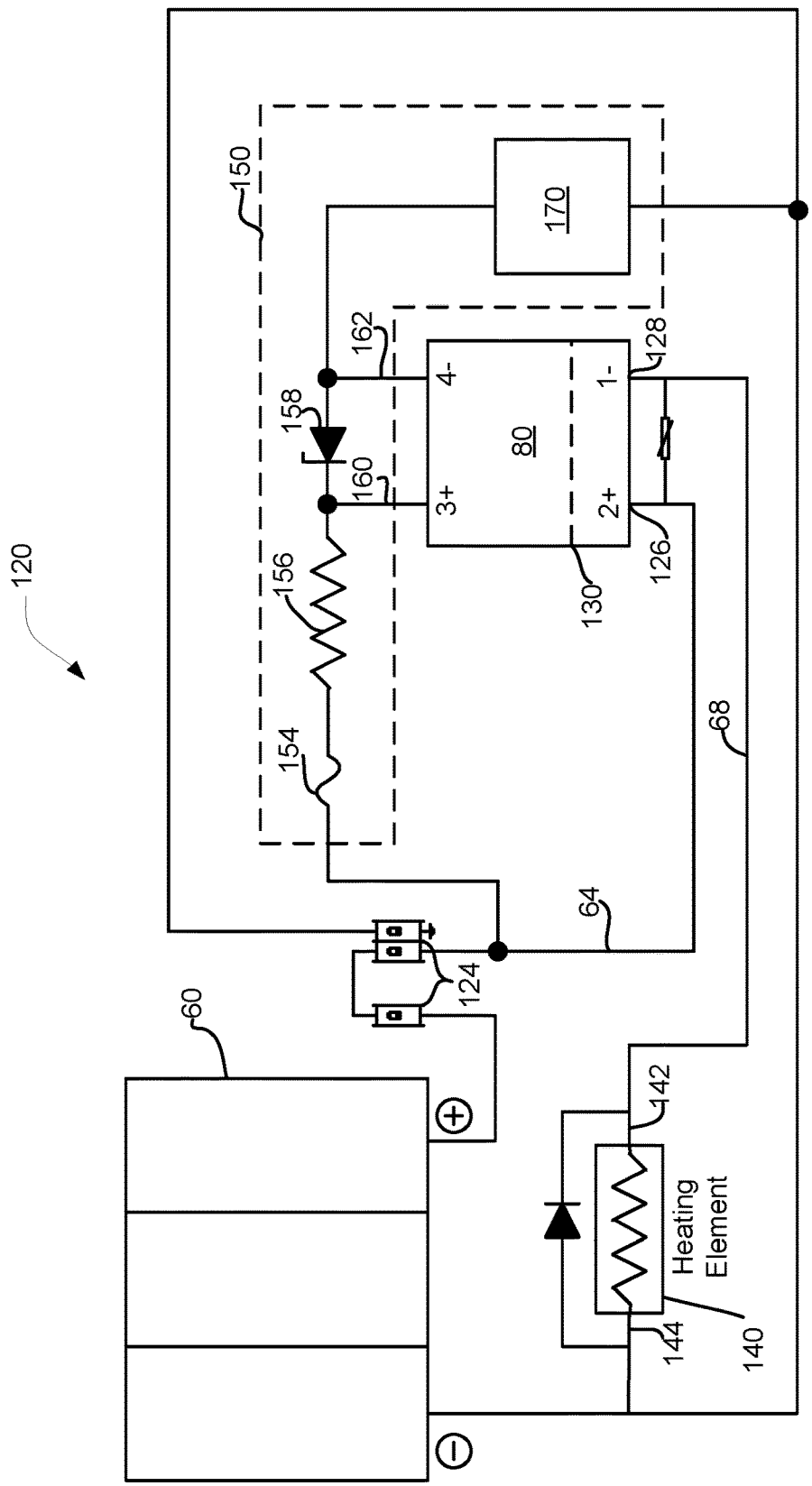
FIG. 6 illustrates a simplified embodiment of a micro-grid PV system.

Though discussed above in relation to performing dynamic allocation of electrical power between active loads and a resistive load, aspects of the presented systems also allow for the generation of very simplified and inexpensive PV systems that may operate entirely autonomously from grid power and without battery banks or other power storage elements. FIG. 6, illustrates such a system. As shown, the system 120 includes a PV array 60 formed of one or more PV panels. A positive output of the PV array 60 is interconnected to the controller 80 via a first conductor 64. One or more breakers 124 may be disposed in-line between the PV array 60 and the controller 80. The first conductor 64 is connected to an input 126 of a relay switch 130 operated by the controller 80. An output 128 of the relay switch 130 is interconnected to an output conductor 68 which is interconnected to an input 142 of a resistive heating element 140. An output 144 of the heating element 140 is interconnected to a negative input of the PV array 60 via a second conductor 66. Accordingly, when the relay switch 130 connects the first connector 64 with the output conductor 68, a circuit is completed through the heating element 140, which generates thermal energy in response to the applied electrical power from the PV array 60.

The system 120 powers the controller utilizing electrical power produced by the PV panel 60. More specifically, the system may power the controller 80 entirely free of any power storage devices (e.g., batteries, capacitors etc.). In order to power the controller 80 without the use of power sources other than the PV array 60, the system incorporates a control loop circuit 150 which is powered by the PV panel 60. The control loop circuit 150 has an input conductor 152 interconnected to the first connector 64, which supplies power from the PV array 60 to the relay switch 130. An output conductor 164 of the control loop 150 is connected to the second conductor 66 of the PV panel to complete a circuit through the control loop circuit 150. A thermostat 170 is disposed within the control loop circuit 150 that is operative to open and close the control loop circuit and thereby power and deactivate the control loop circuit. The thermostat 170 in the present embodiment includes a bi-metallic switch that opens when the temperature of the heating element or a medium which the heating element heats is above an adjustable value (e.g., threshold temperature). In this regard, when the temperature of the element/medium tank drops below the threshold temperature, the switch closes and allows voltage to flow through the control loop 150. Likewise, when the temperature in of the element/medium increases above the threshold temperature, the switch opens and deactivates the control loop 150.

Disposed in-line within the control loop 150 between the input conductor 152 and the output conductor 164 is a voltage regulation circuit. The voltage regulation circuit in the present embodiment is formed of a resistor 156 and zener diode 158 that are sized to limit the current and voltage passing through the input conductor 152. Further, a fuse 154 may be disposed in the control loop circuit 150. This circuit enables a fixed stable voltage to be taken from the generally varying voltage provided by the PV panel which will fluctuate depending on current solar intensity. An input and output 160, 162 interconnect the controller 80 to the control loop 150. In conjunction with the voltage regulation circuit, this allows for powering the controller with regulated electrical power within acceptable operating conditions for the controller 80.

When the control loop 150 is energized (i.e., the thermostat is closed and the PV array is generating electrical power) the controller 80 is powered and operates to close the relay switch 130 and thereby connect the heating element 140 to the PV array. In one arrangement, such connection entails energizing an electromagnet that closes the relay switch while the controller 80 is energized. In this arrangement, when the control loop 150 loses power (e.g., the thermostat opens), the electromagnet loses power and automatically disconnects the heating element 140 form the PV array 60. Further, this results in an open circuit for PV array 60. That is, while the thermostat 170 is open, the PV array is deactivated. While in its simplest form, the controller may entail a simple electromagnet, it will be further appreciated that the control loop architecture described in relation to FIG. 5 may be incorporated into more complex controller systems. For instance, the system 20 of FIG. 1A may likewise incorporate the control loop architecture such that is may operate free of power sources other than the PV array.

To further simplify the system 120, in one embodiment, the PV array 60 generates DC power and is wired in a manner that maintains the output voltage of the array below 80 volts. As will be appreciated, DC PV systems that are in excess of 80 volts are subject to arc fault protection standards. Conversely, systems below the 80 volt threshold are not considered at risk for arc fault. Accordingly, by wiring the PV panels in a manner that maintains maximum voltages below 80 volts, the system is not at risk of arc fault and is yet further simplified.

As will be appreciated, the present system 120 allows for the application of PV power to a heating element with a very simplified control system that operates entirely autonomously. Such a system 120 has numerous practical applications. For instance, such a system may allow for heating water where the heating element 140 is disposed within or provides thermal energy to a tank. Such water heating could be for hot water heating or for ice removal (e.g., for maintaining stock tanks free of ice in remote locations). Other applications include the use of the heating element for cooking. In this regard, the heating element may form a burner or oven element that allows for generating enough thermal energy to cook with in remote locations.

Figure 7:
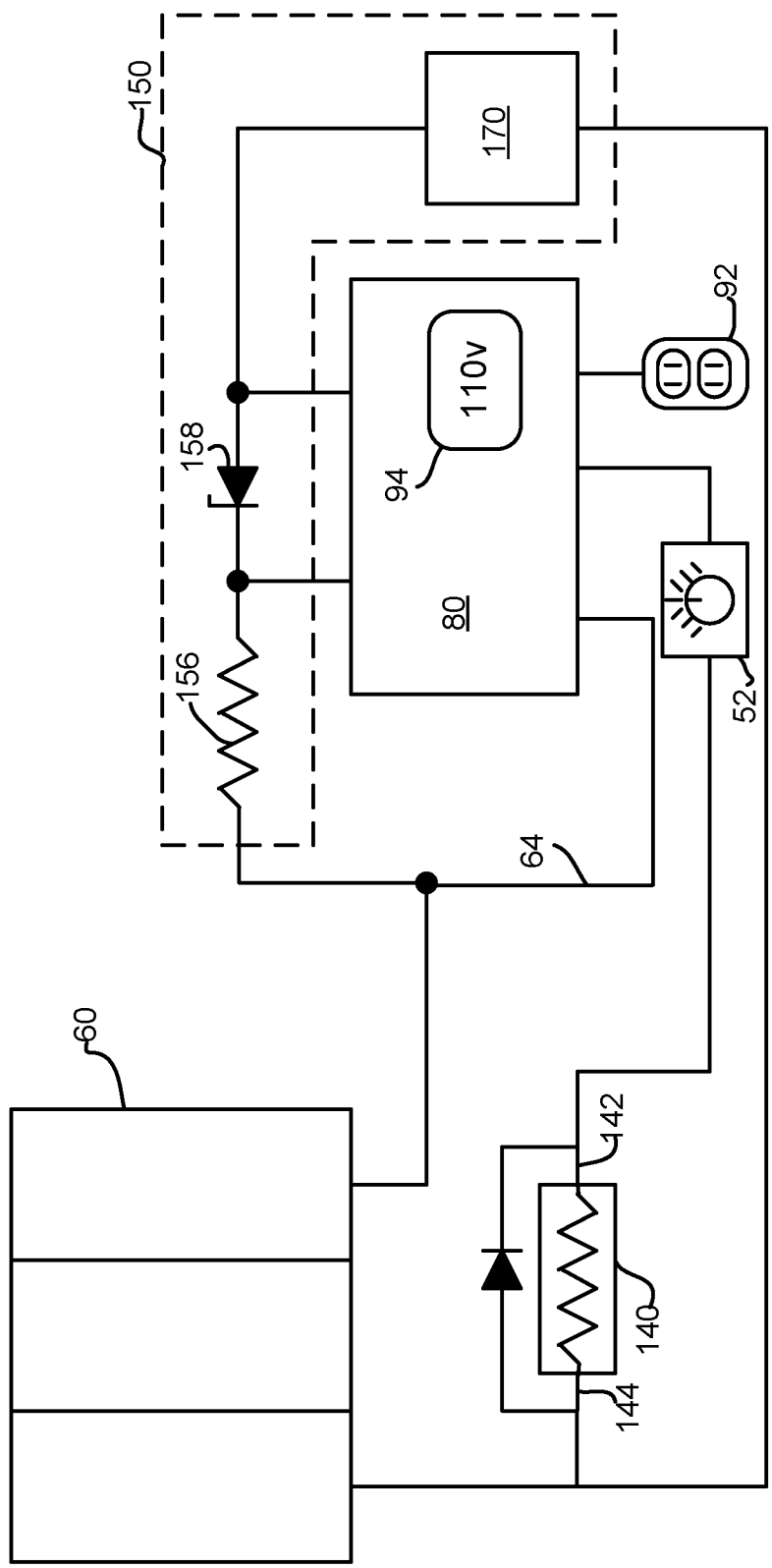
FIG. 7 illustrates an alternate embodiment of the system of FIG. 6.

In a further arrangement, the system of FIG. 6 may be modified to allow for the generation of a constant voltage output. As shown in FIG. 7, the controller 80 is again power by a control loop 150 circuit that receives power from a PV array 60. The controller is operative to apply power from the PV array which to a resistive heating element 140, which is disposable within a media (e.g., water) to be heated. In addition, this embodiment includes an active load circuit 92 (e.g., outlet) that allows a user to power and electrical device. In order to provide a desired output voltage to the active load circuit, a variable resistor 52 (e.g., rheostat) is disposed in series with the heating element 140, which is utilized as a sink in the present embodiment. During use, a user may adjust the variable resistor to alter the resistive load of the PV array and thereby select an output voltage for the active load circuit. In one arrangement, a display 94 is provided that allows a user to see the output voltage of the active circuit. It will be appreciated that when an electrical device is connected to the active circuit 92, the resistive load of the PV panel may change this requiring further adjustment of the variable resistor 52. Such adjustment may be manual or automated, for example, based on a user set voltage. Such a system has application for use in remote locations where it is desirable to maintain a constant output voltage for operating one or more electrical devices.

Figure 8:
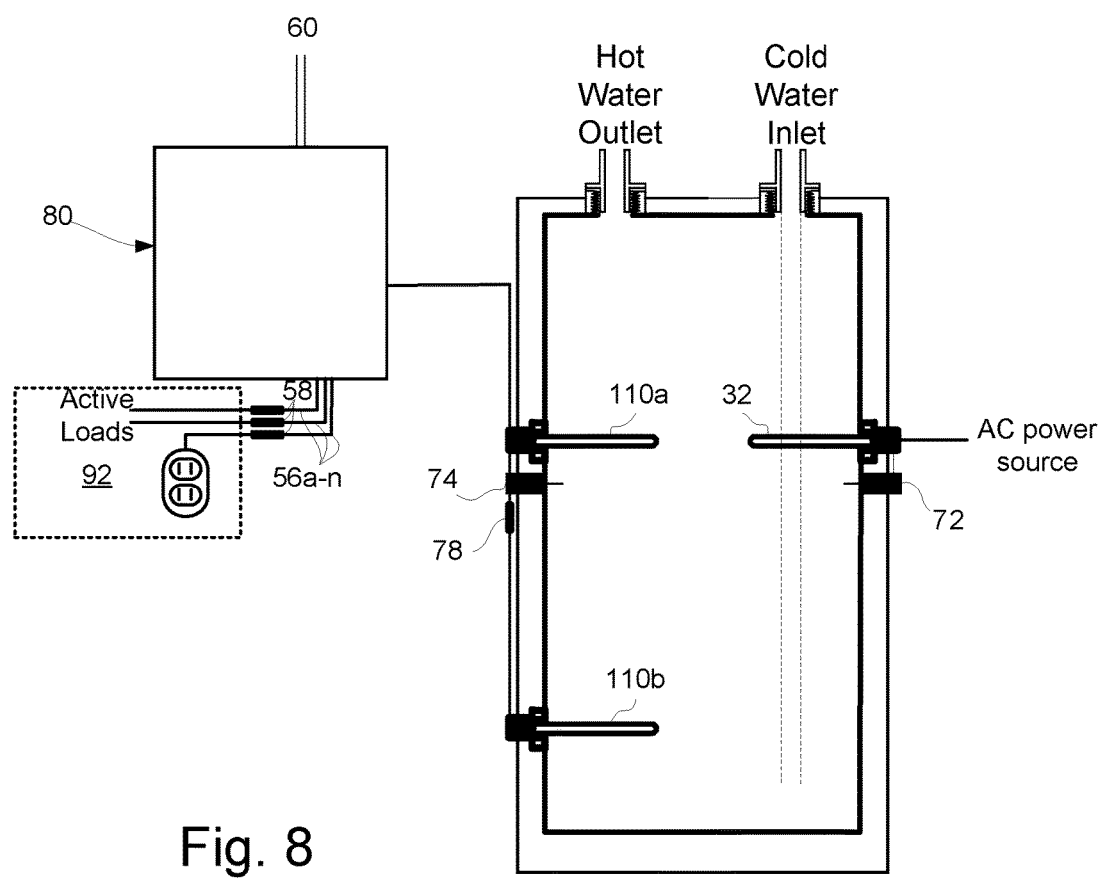
FIG. 8 illustrates one embodiment of an autonomous PV water heating system utilized in conjunction with a utility powered water heater.

While numerous applications exist for the systems discussed above, one particular application is directed heating of hot water where the water is heated by both an autonomous PV system and a utility power source. One exemplary system is illustrated in FIG. 8 where a novel water tank design allows for co-application of autonomous PV power and utility grid power. In this embodiment, a hot water heater 10 is provided that may be utilized to heat water for residential and/or commercial applications. As shown, the hot water heater 10 is an electrical hot water heater that utilizes a utility powered electrical heating element 32 as one heat source for heating water within a storage tank 12. The element 32 is controlled by a first thermostat 72 which activates the element 32 (e.g., completes a circuit) when a temperature within the tank 12 drops below a predetermined temperature. Two additional heating elements 110a and 110b, which are electrically connected to a PV panel/array 60 via a controller 80, are controlled by a second thermostat 74. Further, the first and second PV powered heating elements 110a, 110b may be connected by a relay switch 78.

As shown, the utility powered heating element 32 and the first PV powered heating element 110a are disposed in the upper third or upper half of the tank 12 at a common height. Disposition of these heating elements 32, 110a in the upper portion of the tank allows for heating water near the top of the tank, where water is drawn from the top of the tank when a tap opens. Further, placement of the utility powered element 32 in the upper portion of the tank results in this element deactivating prior to heating water in the lower portion of the tank. That is, water stratifies within the tank and placement of the utility powered element in the upper portion of the tank reduces the use of the utility powered heating element 32 to heat the water in the lower portion of the tank.

To further reduce the use of the utility powered heating element, the first PV powered heating element 110a typically has a higher turn off temperature than the utility powered element 32. In this regard, the first PV powered element 110a heats the water to a temperature above the turn off temperature of the utility powered element. Thus the utility powered element is typically not active when the PV system is generating power.

The relay switch 78 interconnecting the first and second PV powered heating elements activates the lower heating element 110b once the upper element 110a has reached a predetermined temperature. That is, once the water in the upper portion of the tank is heated to a desired temperature, the upper heating element 110a may be deactivated and the lower element 110b may be activated to heat water in the lower portion of the tank. Once the water in the lower portion of the tank reaches a predetermined temperature, both elements 110a and 110 b may be deactivated. Alternatively, the upper and lower elements 110a and 119b may be operated simultaneously, that is, without a relay switch. In any arrangement, the lower heating element 110b acts to pre-heat the water in the tank.

Figure 9:
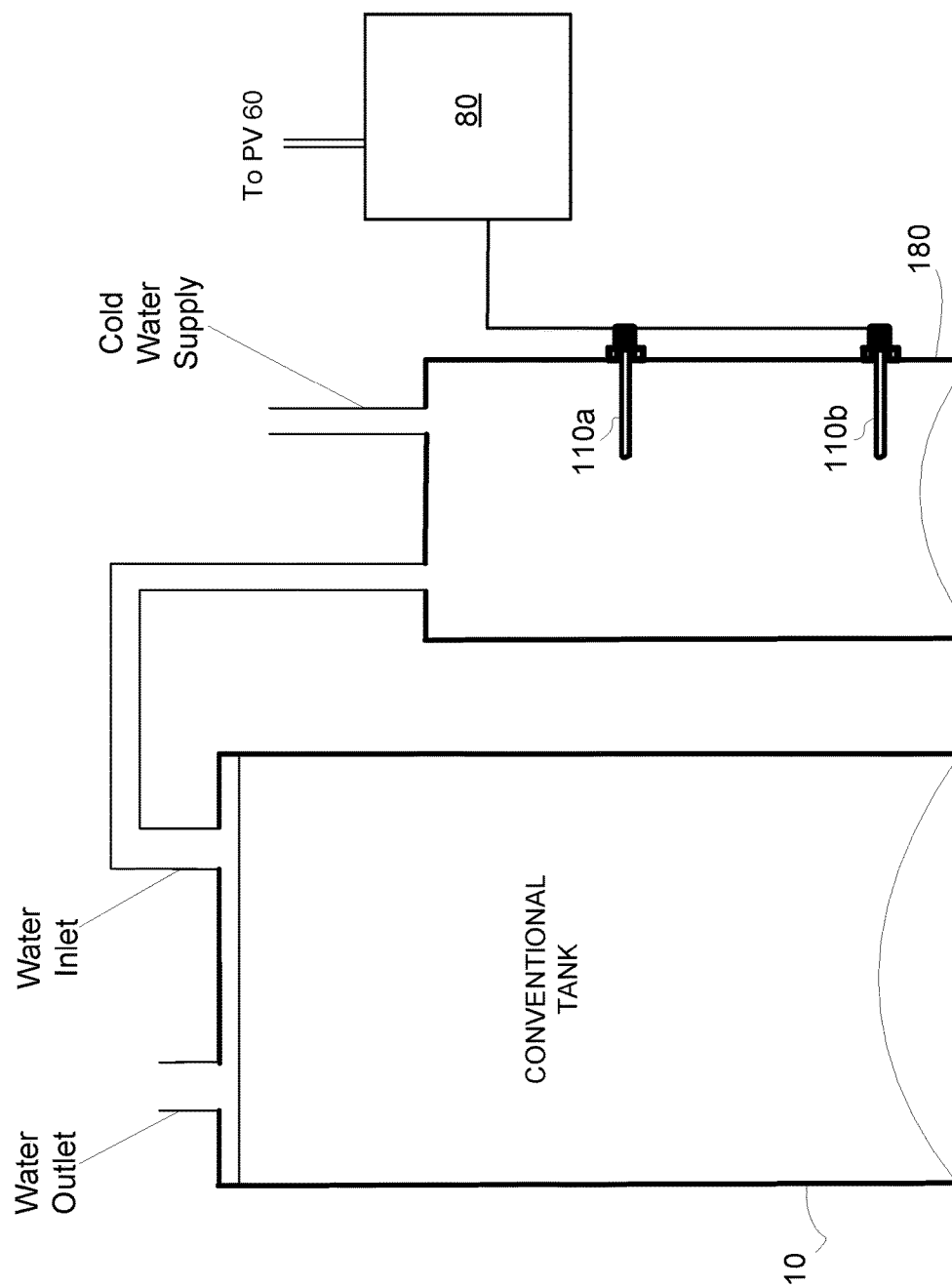
FIG. 9 illustrates another embodiment of an autonomous PV water heating system utilized in conjunction with a utility powered water heater.

FIG. 9 illustrates another embodiment of an autonomous PV system utilized to heat water in conjunction with a utility powered hot water heating element. In this embodiment, a preheat tank 180 is utilized to provide heated water to a conventional hot water heater 10, which may utilize a gas or electric element (i.e., utility powered element). As shown, the preheat tank is plumbed between a water supply line and a water inlet of the conventional water heater 10. The pre-heat tank includes at least one PV powered heating element 110. In the illustrated embodiment, the pre-heat tank 180 includes two PV powered heating elements 110a, 110b. Again, these elements 110a, 110b are electrically connected to a PV array 60 via a controller 80. In this embodiment, the heating elements 110a, 110b heat water in the pre-heat tank which is then introduced into the water heater (e.g., when a tap is opened). Accordingly, the conventional water heater receives water that is significantly warmer than standard tap water thereby reducing the heating requirements of the conventional water heater 10. Further, such a pre-heat PV system may be readily incorporated with existing hot water heaters as a retrofit that requires no integration within the existing water heater.

Figure 10:
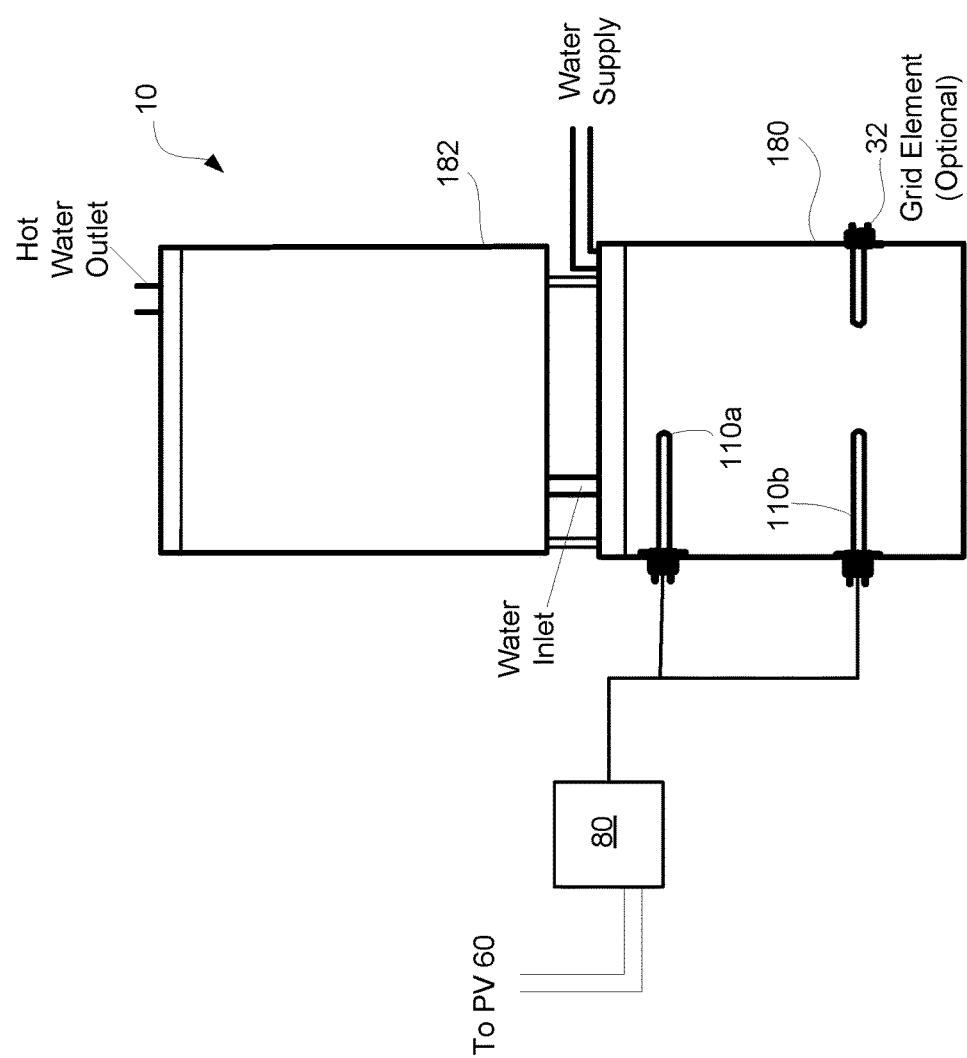
FIG. 10 illustrates another embodiment of an autonomous PV water heating system utilized in conjunction with a utility powered water heater.

FIG. 10, illustrates a pre-heat system that may be utilized with a tank-less water heater 182. Again, a preheat tank 180 is plumbed between a water supply line and a water inlet of the tank-less water heater 182. As with the embodiment of FIG. 9, this allows for pre-heating water prior to its introduction into the tank-less water heater. The pre-heat tank includes one or more PV powered heating elements 110. The pre-heat tank could also include a grid powered heating element 32, however this is not a requirement.

Figure 11:
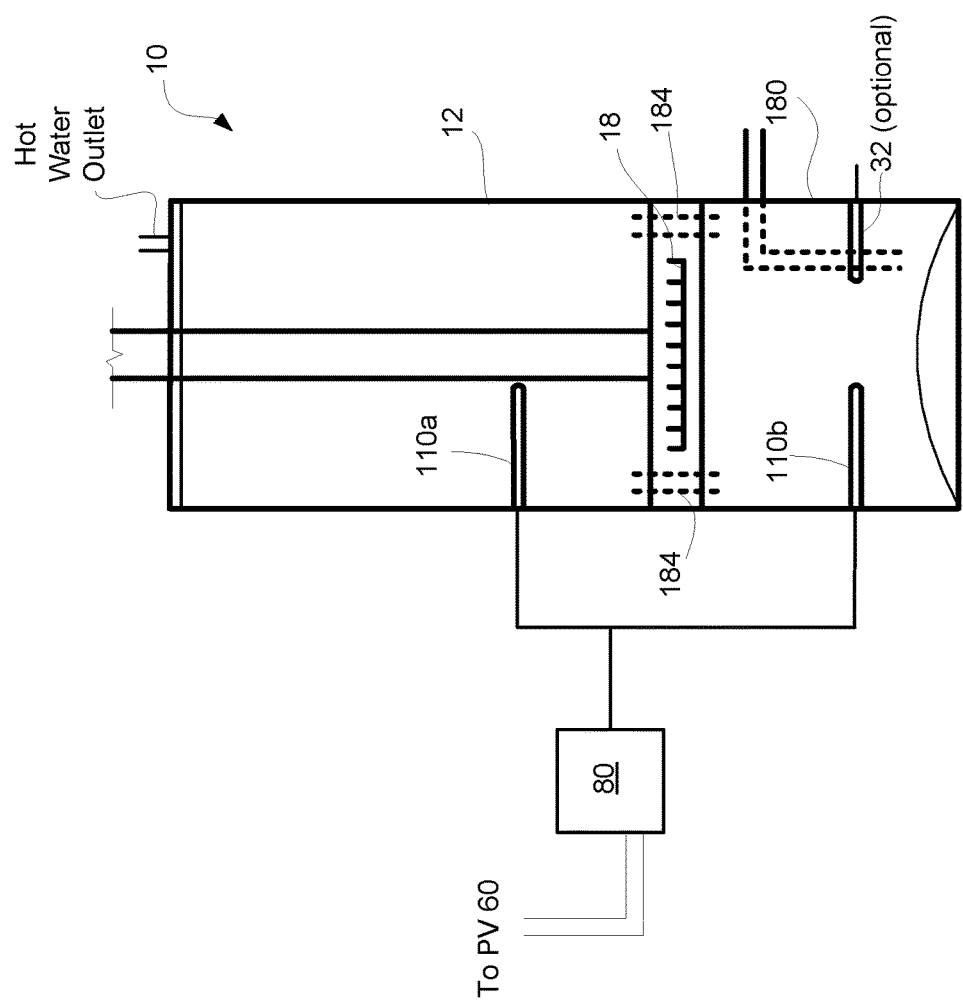
FIG. 11 illustrates another embodiment of an autonomous PV water heating system utilized in conjunction with a utility powered water heater.

FIG. 11 illustrates a PV powered preheat tank 180 integrated into a gas fired water heater. As shown, the preheat tank 180 is disposed below the primary tank 12 of the water heater with a burner 18 disposed there between. As shown, water connections 184 (e.g., pipes) extend between the top of the preheat tank 180 and the bottom of the primary tank 12. As with the embodiments disclosed above, one or more PV powered elements 110a, 110b may be disposed within the preheat tank 180 and/or the primary tank 12. Again, these PV powered elements may be operated autonomously form the operation of the burner 18.

It will be appreciated that the above discussed systems are not limited to any particular use. In other arrangements, a resistive load or heating element may be incorporated into a thermal storage media (e.g., eutectic salts or other phase change materials). Such a thermal storage media may allow for the storage of significant thermal energy during the daylight hours and further allow for the recovery of such energy at a later time utilizing, for example small turbines such as Organic Rankine Cycle (ORC) generators. In such an arrangement, supplying sufficient heat to the thermal storage media may cause it to melt so it stores a significant amount of heat. Upon cooling the material releases its stored heat when changing phase from a liquid back to a solid phase while remaining at a relatively constant temperature. This recovered heat energy may be utilized in various arrangements to produce usable energy (e.g., steam or other evaporated gases) that may be utilized directly or utilized to operate turbines for the generation of electrical energy.

The foregoing description has been presented for purposes of illustration and description. Furthermore, the description is not intended to limit the inventions and/or aspects of the inventions to the forms disclosed herein. Consequently, variations and modifications commensurate with the above teachings, and skill and knowledge of the relevant art, are within the scope of the presented inventions. The embodiments described hereinabove are further intended to explain best modes known of practicing the inventions and to enable others skilled in the art to utilize the inventions in such or other embodiments and with various modifications required by the particular application(s) or use(s) of the presented inventions. It is intended that the appended claims be construed to include alternative embodiments to the extent permitted by the prior art.

The invention claimed is:

1. A water heating system comprising:
a water tank having:
first and second heating elements connected to a micro-grid power source;
a utility powered heating element connected to a utility electrical power grid, wherein the micro-grid power source and the utility electrical power grid are electrically isolated and the first and second heating elements are electrically isolated from the utility powered heating element; and
wherein the first heating element and the utility powered heating element are disposed in an upper half of the water tank and the second heating element is disposed at a height in the water tank below the first heating element;
the micro-grid power source connected to the first and second heating elements, including:
a photovoltaic (PV) array;
a first switch electrically connected to the PV array for receiving electrical power from the PV array and selectively applying the electrical power to the first and second heating elements;
a first thermostat for monitoring a temperature in the water tank and operatively connected to the first switch, wherein electrical power is applied to the first and second heating elements from the PV array in response to an output of the first thermostat; and
a second thermostat for monitoring a temperature in the tank and operatively connected to the utility powered heating element, wherein the second thermostat is operative to activate and deactivate the second heating element.

2. The system of claim 1, wherein the first thermostat is set to a higher temperature that the second thermostat, wherein the first heating element operates above a turn-off temperature of the utility powered heating element.

3. The system of claim 1, wherein, the first heating element and the utility powered heating element are disposed at a common height in the water tank.

4. The system of claim 1, further comprising a relay switch connecting the first and second heating elements, wherein the relay switch connects the second heating element to the electrical power from the PV array after the first thermostat identifies a predetermined temperature in the tank.

5. The system of claim 1, further comprising:
a preheat tank fluidly connected to an inlet of the water tank, wherein the preheat tank includes a third heating element, wherein the first switch is adapted to selectively apply the electrical power from the PV array to the third heating element.

6. The system of claim 1, further comprising:
a tankless water heater, wherein an inlet of the tankless water heater is connected to an outlet of the water tank.

7. The system of claim 1, further comprising:
a boiler wherein an inlet of the boiler is connected to an outlet of the water tank.

* * * * *